(12) United States Patent
Imayoshi et al.

(10) Patent No.: US 10,699,993 B2
(45) Date of Patent: Jun. 30, 2020

(54) WIRING BOARD, ELECTRONIC DEVICE, AND ELECTRONIC MODULE

(71) Applicant: KYOCERA Corporation, Kyoto, Kyoto (JP)

(72) Inventors: Michio Imayoshi, Kyoto (JP); Yousuke Moriyama, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 16/418,636

(22) Filed: May 21, 2019

(65) Prior Publication Data

US 2019/0273036 A1    Sep. 5, 2019

Related U.S. Application Data

(62) Division of application No. 15/578,032, filed as application No. PCT/JP2016/068669 on Jun. 23, 2016, now Pat. No. 10,319,672.

(30) Foreign Application Priority Data

Jun. 25, 2015   (JP) ................................ 2015-127807

(51) Int. Cl.
*H01L 23/13*    (2006.01)
*H01L 33/62*    (2010.01)
(Continued)

(52) U.S. Cl.
CPC ...... *H01L 23/49811* (2013.01); *H01L 21/486* (2013.01); *H01L 21/4807* (2013.01);
(Continued)

(58) Field of Classification Search
CPC ......... H01L 23/49811; H01L 23/49838; H01L 23/49827; H01L 23/3121; H01L 23/13;
(Continued)

(56) References Cited

U.S. PATENT DOCUMENTS 6,337,123 B1 * 1/2002 Ryugo ................. B32B 18/00
                                                       174/258
6,743,316 B2 * 6/2004 Harada ............... H01L 21/481
                                                       156/89.11
(Continued)

FOREIGN PATENT DOCUMENTS

JP    2000-216439 A    8/2000
JP    2007-318076 A    12/2007
(Continued)

OTHER PUBLICATIONS

International Search Report, PCT/JP2016/068669, dated Aug. 16, 2016, 2 pgs.

*Primary Examiner* — Galina G Yushina
(74) *Attorney, Agent, or Firm* — Volpe and Koenig, P.C.

(57) ABSTRACT

A wiring board includes an insulating substrate that is rectangular in a plan view, a plurality of mount electrodes arranged to face each other on a first main surface of the insulating substrate along a pair of opposing sides of the insulating substrate in a plan view, a plurality of terminal electrodes arranged to face each other on a second main surface of the insulating substrate along the pair of opposing sides of the insulating substrate in a perspective plan view, and an inner metal layer arranged inside the insulating substrate and extending in a direction perpendicular to the pair of opposing sides of the insulating substrate in a perspective plan view.

8 Claims, 13 Drawing Sheets

(51) Int. Cl.
*H01L 23/00* (2006.01)
*H01L 23/498* (2006.01)
*H05K 1/02* (2006.01)
*H05K 3/46* (2006.01)
*H01L 21/48* (2006.01)
*H01L 23/31* (2006.01)
*H01L 33/52* (2010.01)
*H01L 23/36* (2006.01)
*H01L 25/16* (2006.01)
*H01L 33/64* (2010.01)

(52) U.S. Cl.
CPC .......... *H01L 21/4853* (2013.01); *H01L 23/13* (2013.01); *H01L 23/3121* (2013.01); *H01L 23/49827* (2013.01); *H01L 23/49838* (2013.01); *H01L 33/52* (2013.01); *H01L 33/62* (2013.01); *H05K 1/02* (2013.01); *H05K 3/46* (2013.01); *H01L 23/36* (2013.01); *H01L 23/49822* (2013.01); *H01L 24/16* (2013.01); *H01L 24/48* (2013.01); *H01L 24/81* (2013.01); *H01L 24/83* (2013.01); *H01L 25/167* (2013.01); *H01L 33/647* (2013.01); *H01L 2224/131* (2013.01); *H01L 2224/13144* (2013.01); *H01L 2224/16227* (2013.01); *H01L 2224/48227* (2013.01); *H01L 2924/12035* (2013.01); *H01L 2924/12041* (2013.01); *H01L 2924/15159* (2013.01); *H01L 2924/15313* (2013.01); *H01L 2924/181* (2013.01); *H01L 2924/19041* (2013.01); *H01L 2924/19043* (2013.01); *H01L 2924/3511* (2013.01); *H01L 2933/0066* (2013.01)

(58) Field of Classification Search
CPC ............. H01L 23/49822; H01L 21/486; H01L 21/4807; H01L 21/4853; H01L 24/83; H01L 24/48; H01L 24/81; H01L 25/167; H01L 33/62; H01L 33/52; H01L 33/647; H01L 2924/15313; H01L 2924/15159; H01L 2924/3511; H01L 2924/19041; H01L 2924/12041; H01L 2924/12035; H01L 2224/48227; H01L 2224/16227; H01L 2224/13144; H01L 2224/131; H05K 3/46; H05K 1/02
See application file for complete search history.

(56) References Cited

U.S. PATENT DOCUMENTS

| | | | |
|---|---|---|---|
| 2007/0187137 A1* | 8/2007 | Isebo | H01L 23/15 174/255 |
| 2007/0273014 A1 | 11/2007 | Lee et al. | |
| 2010/0001390 A1 | 1/2010 | Lee et al. | |
| 2012/0098137 A1 | 4/2012 | Usui et al. | |
| 2015/0146397 A1* | 5/2015 | Fujihara | H05K 1/181 361/767 |
| 2015/0270068 A1* | 9/2015 | Hattori | H01G 4/30 361/301.4 |
| 2015/0276198 A1 | 10/2015 | Hata et al. | |

FOREIGN PATENT DOCUMENTS

| | | |
|---|---|---|
| JP | 2009-239137 A | 10/2009 |
| JP | 2009-267041 A | 11/2009 |
| JP | 2013-070224 A | 4/2013 |
| JP | 2013-106008 A | 5/2013 |

* cited by examiner

WIRING BOARD, ELECTRONIC DEVICE, AND ELECTRONIC MODULE

CROSS REFERENCE TO RELATED APPLICATION

This application is a divisional of U.S. patent application Ser. No. 15/578,032, filed Nov. 29, 2017, which is a § 371 of International Patent Application No. PCT/JP2016/068669, filed Jun. 23, 2016, which claims priority to Japanese Application 2015-127807, filed Jun. 25, 2015, which are hereby incorporated by reference as if fully set forth.

FIELD

The present invention relates to a wiring board, an electronic device, and an electronic module.

BACKGROUND

A wiring board known in the art includes an insulating substrate, a mount electrode arranged on a first main surface of the insulating substrate for mounting an electronic component, a terminal electrode arranged on a second main surface of the insulating substrate, and a wiring conductor connected to the mount electrode and the terminal electrode and arranged inside or on the main surfaces of the insulating substrate. To join an electronic device including an electronic component and a wiring board to, for example, a module substrate using a bond, such as solder, the terminal electrode is joined to the module substrate using the bond, such as solder (refer to Japanese Unexamined Patent Application Publication No. 2009-267041).

BRIEF SUMMARY

Technical Problem

Highly functional and thin electronic devices have been developed recently. A thinner wiring board for an electronic device is more likely to deform or warp during use when the electronic device receives thermal stress resulting from differences in coefficients of thermal expansion between the insulating substrate and the mount electrode and between the insulating substrate and the terminal electrode. This may cause connection faults between the electronic component and the wiring board or between the wiring board and the module substrate when the electronic device is used for a long time period.

Solution to Problem

One aspect of the present invention provides a wiring board including an insulating substrate that is rectangular in a plan view, a plurality of mount electrodes arranged to face each other on a first main surface of the insulating substrate along a pair of opposing sides of the insulating substrate in a plan view, a plurality of terminal electrodes arranged to face each other on a second main surface of the insulating substrate along the pair of opposing sides of the insulating substrate in a perspective plan view, and an inner metal layer arranged inside the insulating substrate and extending in a direction perpendicular to the pair of opposing sides of the insulating substrate in a perspective plan view.

Another aspect of the present invention provides an electronic device including the wiring board with the above structure, and an electronic component mounted on the wiring board.

Another aspect of the present invention provides an electronic module including the electronic device with the above structure, and a module substrate including a connection pad to which the electronic device is connected using a bond.

Advantageous Effects

The wiring board according to the above aspect of the present invention includes an insulating substrate that is rectangular in a plan view, a plurality of mount electrodes arranged to face each other on a first main surface of the insulating substrate along a pair of opposing sides of the insulating substrate in a plan view, a plurality of terminal electrodes arranged to face each other on a second main surface of the insulating substrate along the pair of opposing sides of the insulating substrate in a perspective plan view, and an inner metal layer arranged inside the insulating substrate and extending in a direction perpendicular to the pair of opposing sides of the insulating substrate in a perspective plan view. If the wiring board receives high heat during use of the electronic device, the inner metal layer extending perpendicular to the pair of opposing sides reduces the concentration of unidirectional thermal stress caused by differences in coefficients of thermal expansion between the insulating substrate and the mount electrodes and between the insulating substrate and the terminal electrodes, and thus prevents the wiring board from deforming or warping. The wiring board with this structure has better connection to the electronic component or to the module substrate. The wiring board thus has high reliability.

An electronic device according to another aspect of the present invention includes the wiring board according to the above aspect, and an electronic component mounted on the wiring board. This electronic device can have long-term high reliability.

An electronic module according to another aspect of the present invention includes the electronic device according to the above aspect, and a module substrate including a connection pad to which the electronic device is connected using a bond. This electronic module can have long-term high reliability.

DETAILED DESCRIPTION

Figure 1A:
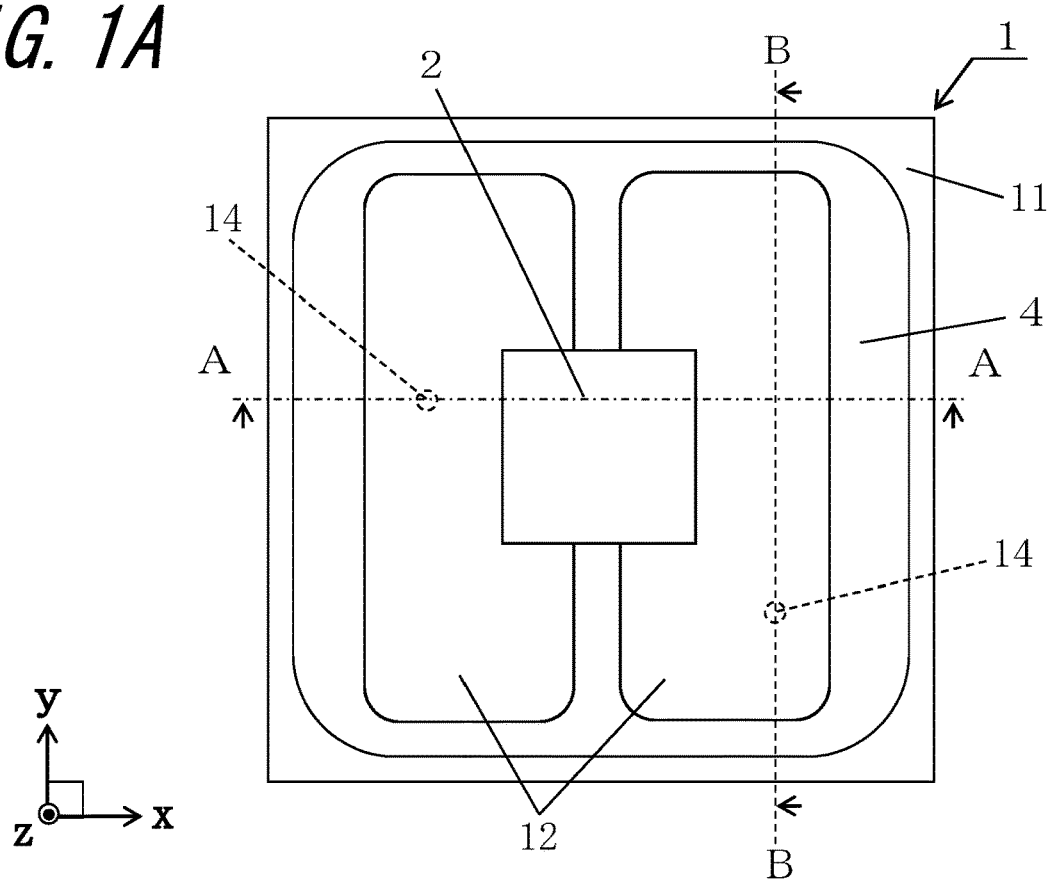
FIG. 1A is a top view of an electronic device according to a first embodiment of the present invention.

One or more embodiments of the present invention will now be described with reference to the accompanying drawings.

First Embodiment

A light-emitting device according to a first embodiment of the present invention includes a wiring board 1 and an electronic component 2 mounted on a top surface of the wiring board 1 as shown in FIGS. 1A to 3B. As shown in FIGS. 4A and 4B, for example, an electronic device is connected to connection pads 51 on a module substrate 5 included in an electronic module using a bond 6.

The wiring board 1 according to the present embodiment includes an insulating substrate 11, which is rectangular in a plan view, a plurality of (two in embodiments of the present invention) mount electrodes 12, which are arranged to face each other on a first main surface of the insulating substrate 11 to extend along a pair of opposing sides of the insulating substrate 11 in a plan view, a plurality of (two in embodiments of the present invention) terminal electrodes 13, which are arranged to face each other on a second main surface of the insulating substrate 11 to extend along the pair of sides of the insulating substrate 11 in a perspective plan view, and wiring conductors 14, which are connected to the mount electrodes 12 and the terminal electrodes 13 and arranged inside or on the surface of the insulating substrate 11. The wiring board 1 also includes an inner metal layer 15 inside the insulating substrate 11. The inner metal layer 15 extends in a direction perpendicular to the pair of opposing sides of the insulating substrate 11 in a perspective plan view. In FIGS. 1A to 4B, the electronic device is mounted in an xy-plane in a virtual xyz space. In FIGS. 1A to 4B, the upward direction refers to a positive direction of a virtual z-axis. The upward or downward directions described herein are for descriptive purposes only and do not limit the directions in actual use of the wiring board 1 or other parts.

Figure 1B:
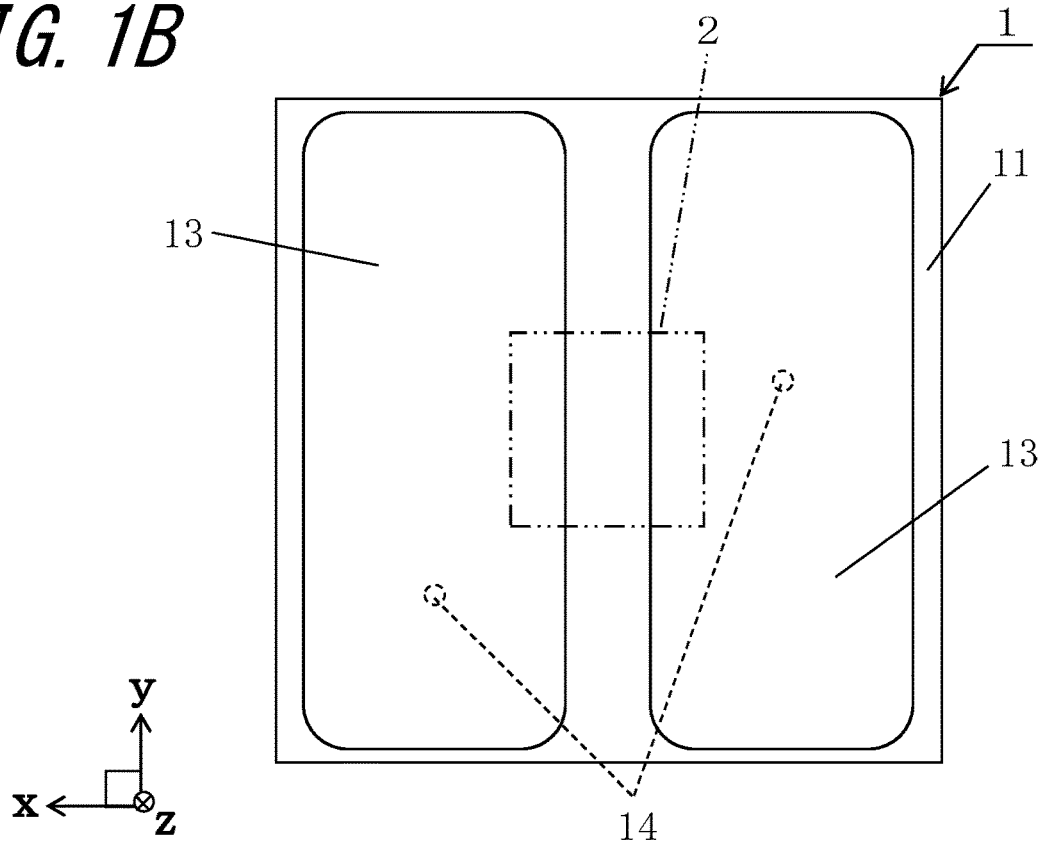
FIG. 1B is a bottom view of the electronic device shown in FIG. 1A.
Figure 2:
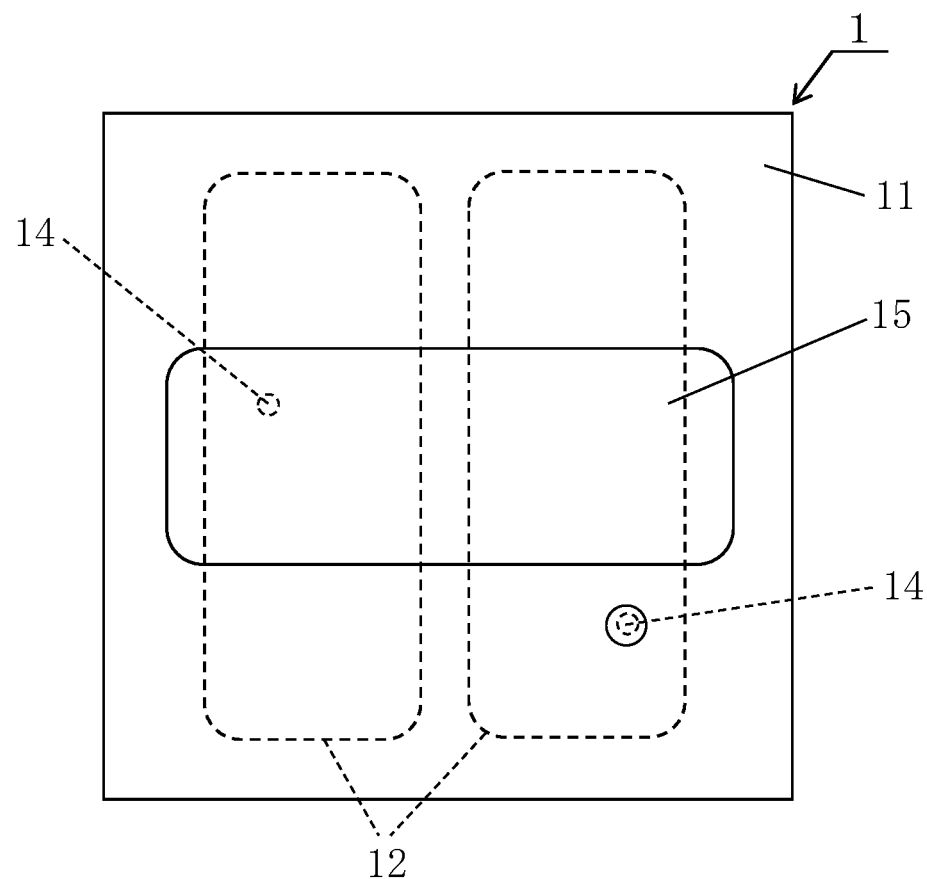
FIG. 2 is a top view showing the inside of a wiring board included in the electronic device shown in FIGS. 1A and 1B.

In FIG. 1B, a two-dot chain line indicates the region in which the electronic component 2 is placed in a perspective plan view. In FIG. 2, broken lines indicate the regions in which the mount electrodes 12 are placed in a perspective plan view. In FIGS. 1A to 2, broken lines indicate the regions in which the mount electrodes 12, the terminal electrodes 13, the inner metal layer 15, and the wiring conductors 14 (feedthrough conductors) are superposed.

Figure 3A:
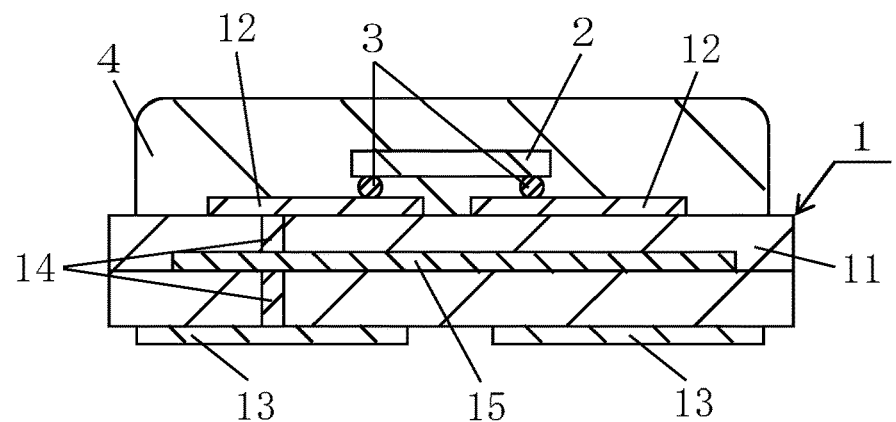
FIG. 3A is a longitudinal sectional view of the electronic device taken along line A-A in FIG. 1A.
Figure 3A:
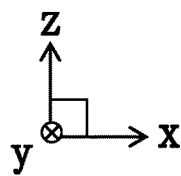
Figure 3B:
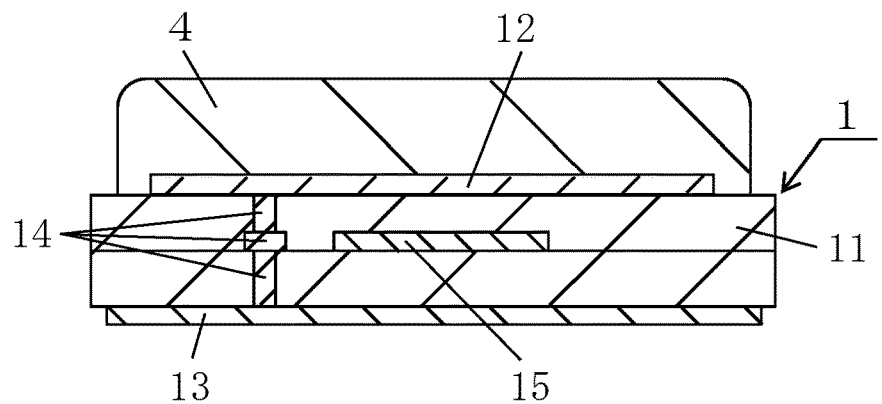
FIG. 3B is a longitudinal sectional view of the electronic device taken along line B-B in FIG. 1A.
Figure 3B:
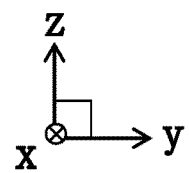
Figure 4A:
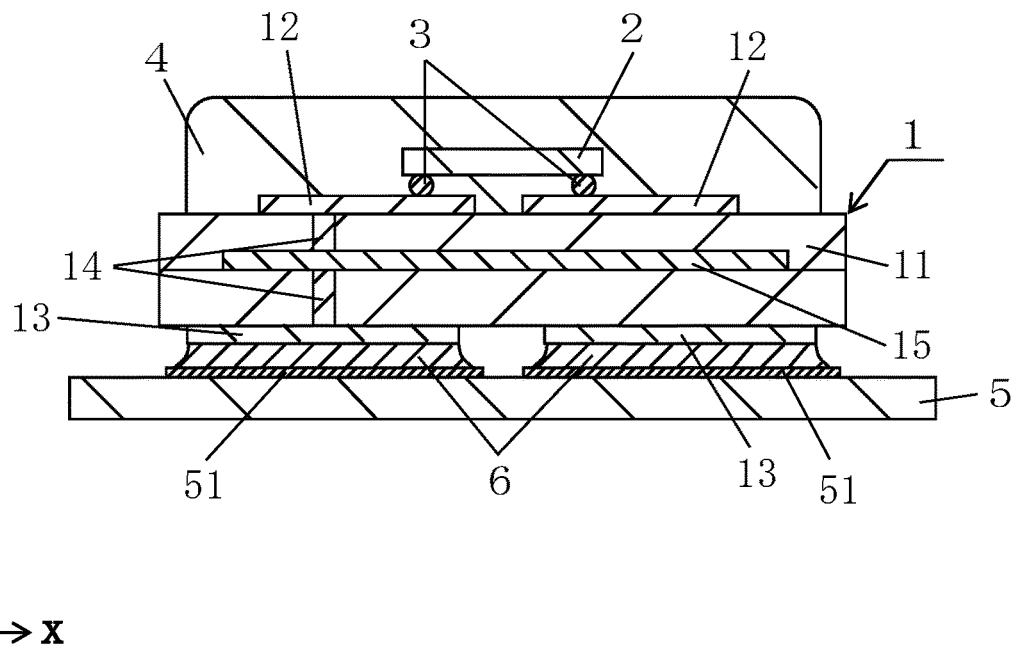
FIGS. 4A and 4B are longitudinal sectional views of an electronic module including the electronic device shown in FIGS. 1A and 1B mounted on a module substrate.
Figure 4B:
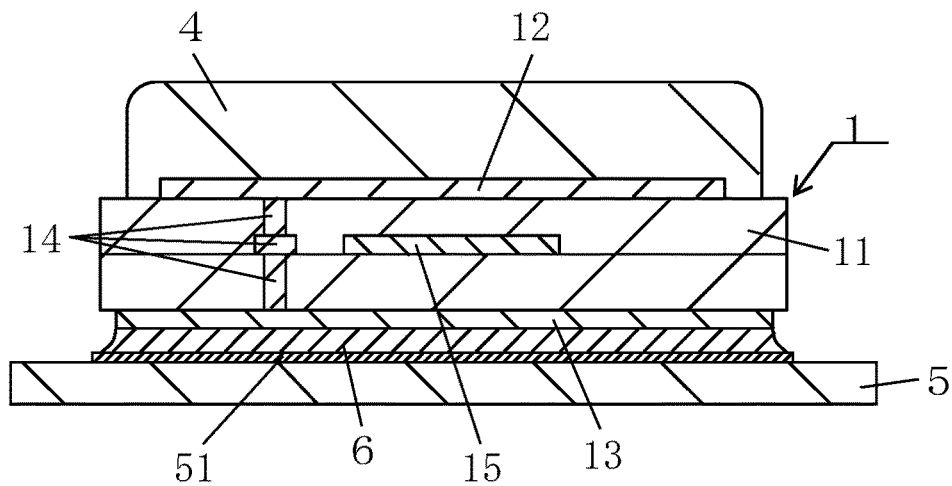

The insulating substrate 11 has the first main surface (top surface in FIGS. 1A, 2, 3A, and 3B) and the second main surface (bottom surface in FIGS. 1B, 3A, and 3B). In a plan view, the insulating substrate 11 is rectangular, and has two pairs of opposing sides (four sides) on each of the first and second main surfaces. The insulating substrate 11 functions as a support for the electronic component 2. The electronic component 2 is bonded and fixed onto the mount electrodes 12 arranged on the first main surface of the insulating substrate 11 using connection members 3, such as solder bumps.

For example, the insulating substrate 11 may be formed from ceramics such as sintered aluminum oxide (alumina ceramic), sintered aluminum nitride, sintered mullite, or sintered glass ceramic. For the insulating substrate 11 formed from, for example, sintered aluminum oxide, the powders of raw materials such as aluminum oxide ($Al_2O_3$), silicon oxide ($SiO_2$), magnesium oxide (MgO), and calcium oxide (CaO) are mixed with an appropriate organic binder and a solvent to form slurry. The slurry is then shaped into a sheet with a known method using a doctor blade or calendering to obtain a ceramic green sheet. The ceramic green sheet then undergoes punching as appropriate. Multiple ceramic green sheets prepared in this manner are laminated on one another as appropriate to form a green body. This green body is then fired at high temperature (about 1600° C.) to complete the insulating substrate 11 including multiple insulating layers.

The plurality of (two in embodiments of the present invention) mount electrodes 12 are arranged to face each other on the first main surface of the insulating substrate 11 along the pair of opposing sides of the insulating substrate 11 in a plan view. The plurality of (two in embodiments of the present invention) terminal electrodes 13 are arranged to face each other on the second main surface of the insulating substrate 11 along the pair of opposing sides of the insulating substrate 11 in a perspective plan view. In the example shown in FIGS. 1A to 3B, the two mount electrodes 12 and the two terminal electrodes 13 extend parallel to each other in Y-direction along the pair of opposing sides. The mount electrodes 12 and the terminal electrodes 13 have larger dimensions in Y-direction than in X-direction. The mount electrodes 12 electrically connect the electronic component 2 mounted on the wiring board 1 to the module substrate 5 or join the wiring board 1 to the electronic component 2. The terminal electrodes 13 electrically connect the electronic component 2 mounted on the wiring board 1 to the module substrate 5 or join the wiring board 1 to the module substrate 5. The wiring conductors 14 are electrically connected to the mount electrodes 12 and the terminal electrodes 13 to electrically connect the electronic component 2 mounted on the wiring board 1 to the module substrate 5. The wiring conductors 14 include wiring layers formed inside or on the surface of the insulating substrate 11 and feedthrough conductors extending through the insulator substrate 11 to electrically connect the upper and lower wiring layers.

The inner metal layer 15 is arranged inside the insulating substrate 11 and extends perpendicular to the pair of opposing sides of the insulating substrate 11 in a perspective plan view. The inner metal layer 15 arranged inside the insulating substrate 11 extends over an area of about 10 to 70% of the insulating substrate 11 in a perspective plan view. In the example shown in FIGS. 1A to 3B, the inner metal layer 15 extends in X-direction, which is perpendicular to the pair of opposing sides, between the insulating layers of the insulating substrate 11. The inner metal layer 15 has a larger dimension in X-direction than in Y-direction. Being perpendicular in a perspective plan view herein refers to the mount electrodes 12 and the terminal electrodes 13, which are long in a first direction (Y-direction in FIGS. 1A to 3B), and the inner metal layer 15, which is long in a second direction (X-direction in FIGS. 1A to 3B), having their longitudinal directions perpendicular to each other. As in the example shown in FIGS. 1A to 3B, the inner metal layer 15 may be connected to or may not be electrically connected to the wiring conductors 14 (and thus to the mount electrodes 12 and to the terminal electrodes 13).

The mount electrodes 12, the terminal electrodes 13, the wiring conductors 14, and the inner metal layer 15 are formed from metalizing powder metal mainly composed of, for example, tungsten (W), molybdenum (Mo), manganese (Mn), silver (Ag), or copper (Cu). The mount electrodes 12, the terminal electrodes 13, and the wiring conductors 14 are formed by, for example, applying a metalizing paste for the mount electrodes 12, the terminal electrodes 13, and the wiring conductors 14 to the ceramic green sheets for the insulating substrate 11 by a printing method such as screen printing, and by firing the ceramic green sheets for the insulating substrate 11 with the applied paste. To form feedthrough conductors, for example, through-holes are formed in the ceramic green sheets for the insulating substrate 11 by punching using a die or by laser processing. The through-holes are then filled with a metalizing paste for the feedthrough conductors by the printing method. The paste is then fired together with the ceramic green sheets for the insulating substrate 11. The metalizing paste is prepared by mixing the powder metal described above with an appropriate solvent and a binder and kneading the mixture to have appropriate viscosity. To improve the joining strength with the insulating substrate 11, the paste may contain glass powder or ceramic powder.

The surfaces of the mount electrodes 12, the terminal electrodes 13, and the wiring conductors 14 uncovered on the insulating substrate 11 are covered with plating layers of a highly corrosion-resistant metal such as nickel or gold. The plating layers reduce corrosion of the mount electrodes 12, the terminal electrodes 13, and the wiring conductors 14 and strengthen connection between the mount electrodes 12 and the electronic component 2, between the mount electrodes 12 and the connection member 3, or between the module substrate 5 and the terminal electrodes 13. For example, a nickel plating layer with a thickness of about 1 to 10 μm and a gold plating layer with a thickness of about 0.1 to 3 μm are sequentially deposited on the portions of the surfaces of the mount electrodes 12, the terminal electrodes 13, and the wiring conductors 14 uncovered on the insulating substrate 11.

The plating layers may not be the nickel/gold plating layers, but may be, for example, any other plating layers including nickel/gold/silver plating layers or nickel/palladium/gold plating layers.

An electronic device can be formed by mounting the electronic component 2 on the mount electrodes 12 arranged on the first main surface of the wiring board 1. The electronic component 2 mounted on the wiring board 1 is, for example, a semiconductor device such as an integrated circuit (IC) chip or a large-scale integrated circuit (LSI) chip, a light-emitting device, a quartz oscillator, a piezoelectric element such as a piezoelectric vibrator, or one of various sensors. When, for example, the electronic component 2 is a semiconductor device to be connected by flip-chip, the semiconductor device is mounted on the wiring board 1 by connecting its electrodes electrically and mechanically to the mount electrodes 12 using the connection members 3, such as solder bumps, gold bumps, or a conductive resin (for example, anisotropic conductive resin). When, for example, the electronic component 2 is a semiconductor device to be connected by wire bonding, the semiconductor device is fixed onto one mount electrode 12, on which the electronic component 2 is mounted, using a bonding member such as a low-melting point brazing material or a conductive resin, and then mounted on the wiring board 1 by connecting its electrodes electrically to the other mount electrode 12 using the connection member 3, such as a bonding wire. The wiring board 1 may have a plurality of electronic components 2 or other types of electronic components such as a resistor, a capacitor, or a Zener diode mounted as appropriate. The electronic component 2 may be encapsulated with an encapsulant 4, such as resin or glass, or with a lid made of resin, glass, ceramic, or metal as appropriate.

As in the example shown in FIGS. 4A and 4B, the electronic device in the present embodiment is connected to the connection pads 51 on the module substrate 5 with the bond 6 such as solder to complete the electronic module.

The wiring board 1 according to the present embodiment includes the insulating substrate 11, which is rectangular in a plan view, the plurality of mount electrodes 12, which are arranged to face each other on the first main surface of the insulating substrate 11 along the pair of opposing sides of the insulating substrate 11 in a plan view, the plurality of terminal electrodes 13, which are arranged to face each other on the second main surface of the insulating substrate 11 along the pair of sides of the insulating substrate 11 in a perspective plan view, and the inner metal layer 15, which extends inside the insulating substrate 11 in a direction perpendicular to the pair of opposing sides of the insulating substrate 11 in a perspective plan view. If the wiring board 1 receives high heat during use of the electronic device, the inner metal layer 15 extending perpendicular to the pair of opposing sides reduces the concentration of unidirectional thermal stress caused by differences in coefficients of thermal expansion between the insulating substrate 11 and the mount electrodes 12 and between the insulating substrate 11 and the terminal electrodes 13, and thus prevents the wiring board 1 from deforming and warping. The wiring board 1 with this structure has better connection to the electronic component 2 or to the module substrate 5, and can have high reliability.

The wiring board 1 according to the present embodiment may be used in a thin and high-power electronic device, and can have higher reliability. For example, the wiring board 1 may be used as a wiring board 1 for a thin and high-luminescence light-emitting device, on which a light-emitting device is mounted as the electronic component 2.

If the mount electrodes 12 and the terminal electrodes 13 are perpendicular to the inner metal layer 15 in a perspective plan view, the inner metal layer 15 extends perpendicular to the mount electrodes 12 and the terminal electrodes 13. If the wiring board 1 receives high heat during use of the electronic device, the inner metal layer 15 extending perpendicular to the pair of opposing sides reduces the concentration of unidirectional thermal stress caused by differences in coefficients of thermal expansion between the insulating substrate 11 and the mount electrodes 12 and between the insulating substrate 11 and the terminal electrodes 13, and thus prevents the wiring board 1 from deforming and warping. The wiring board 1 with this structure has better connection to the electronic component 2 or to the module substrate 5, and can have high reliability.

The total area of the mount electrodes 12 facing each other in a plan view may be greater than or equal to 30%, or preferably 50% of the area of the first main surface of the insulating substrate 11. The total area of the terminal electrodes 13 facing each other in a plan view may be greater than or equal to 30%, or preferably 50% of the area of the second main surface of the insulating substrate 11 in a plan view.

The region of the inner metal layer 15 perpendicularly superposed with the mount electrodes 12 and the terminal electrodes 13 in a perspective plan view may be greater than or equal to 20% of the area of the inner metal layer 15, or may be greater than or equal to 50% of the total area of the mount electrodes 12 and the terminal electrodes 13. The inner metal layer 15 perpendicularly superposed with the mount electrodes 12 and the terminal electrodes 13 in a large region in a perspective plan view can further enhance the advantages described above. As in the example shown in FIGS. 1A to 3B, if the inner metal layer 15 extends across the gaps between the mount electrodes 12 and between the terminal electrodes 13 in a perspective plan view, the inner metal layer 15 is superposed with the plurality of mount electrodes 12 and the plurality of terminal electrodes 13. If the wiring board 1 receives high heat during use of the electronic device, the inner metal layer 15 extending perpendicular to the pair of opposing sides reduces the concentration of unidirectional thermal stress caused by differences in coefficients of thermal expansion between the insulating substrate 11 and the mount electrodes 12 and between the insulating substrate 11 and the terminal electrodes 13, and the inner metal layer 15 thus effectively prevents the wiring board 1 from deforming and warping. The wiring board 1 with this structure has better connection to the electronic component 2 or to the module substrate 5, and can have high reliability.

The inner metal layer 15 extends across the gaps between the mount electrodes 12 and between the terminal electrodes 13. This structure reduces the portions of the insulating substrate 11 without the mount electrodes 12, the terminal electrodes 13, or the inner metal layer 15 in a perspective plan view. If, for example, the electronic component 2 is a light-emitting device, this structure effectively reduces leakage of light toward the second main surface.

Figure 5:
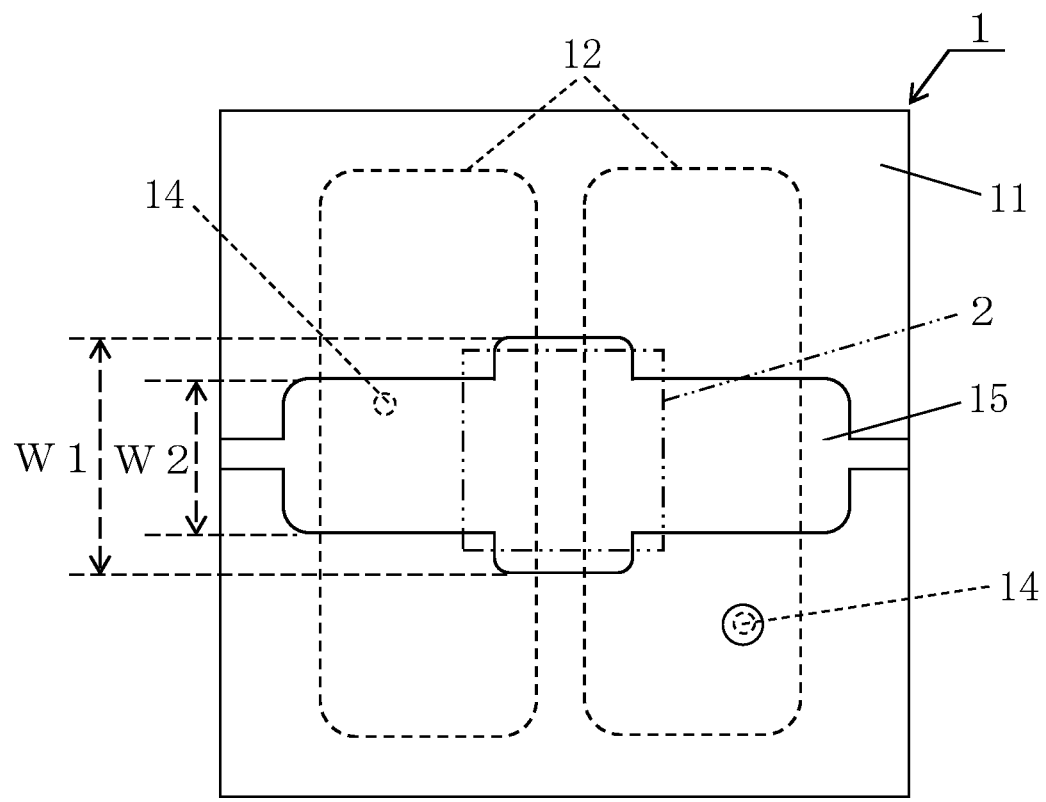
FIG. 5 is a top view showing the inside of a wiring board included in another electronic device according to the first embodiment of the present invention.

As in the example shown in FIG. 5, the inner metal layer 15 has, in a perspective plan view, a width W1 in its portion extending across the gaps between the mount electrodes 12 and between the terminal electrodes 13, which is larger than a width W2 in its other portion. The wiring board 1 with this structure reduces transfer of heat of the electronic component 2 to the terminal electrodes 13 during use of the electronic device, and prevents the inner metal layer 15 from warping at the boundary between the portion (with the width W1) of the inner metal layer 15, which extends across the gaps between the mount electrodes 12 and between the terminal electrodes 13, and the other portion (with the width W2) of the inner metal layer 15. This structure reduces stress between the wiring board 1 and the electronic component 2, or between the wiring board 1 and the module substrate 5. The wiring board 1 with this structure has better connection between the components, and can have high reliability.

If the inner metal layer 15 is superposed with the electronic component 2 in a perspective plan view, the electronic component 2 can effectively dissipate heat in a direction perpendicular to a pair of opposing sides of the insulating substrate 11 during use of the electronic device.

As shown in FIG. 5, the inner metal layer 15 may extend to the outer edge of the insulating substrate 11 in the direction perpendicular to the pair of opposing sides of the insulating substrate 11 in a perspective plan view. In this structure, the insulating substrate 11 dissipates heat through the inner metal layer 15 toward the outer edge in the direction perpendicular to the pair of opposing sides of the insulating substrate 11. The wiring board 1 with this structure transfers less heat to the terminal electrodes 13, and is more effectively prevented from deforming or warping. The wiring board 1 with this structure has better connection to the electronic component 2 or to the module substrate 5, and can have high reliability.

Figure 6A:
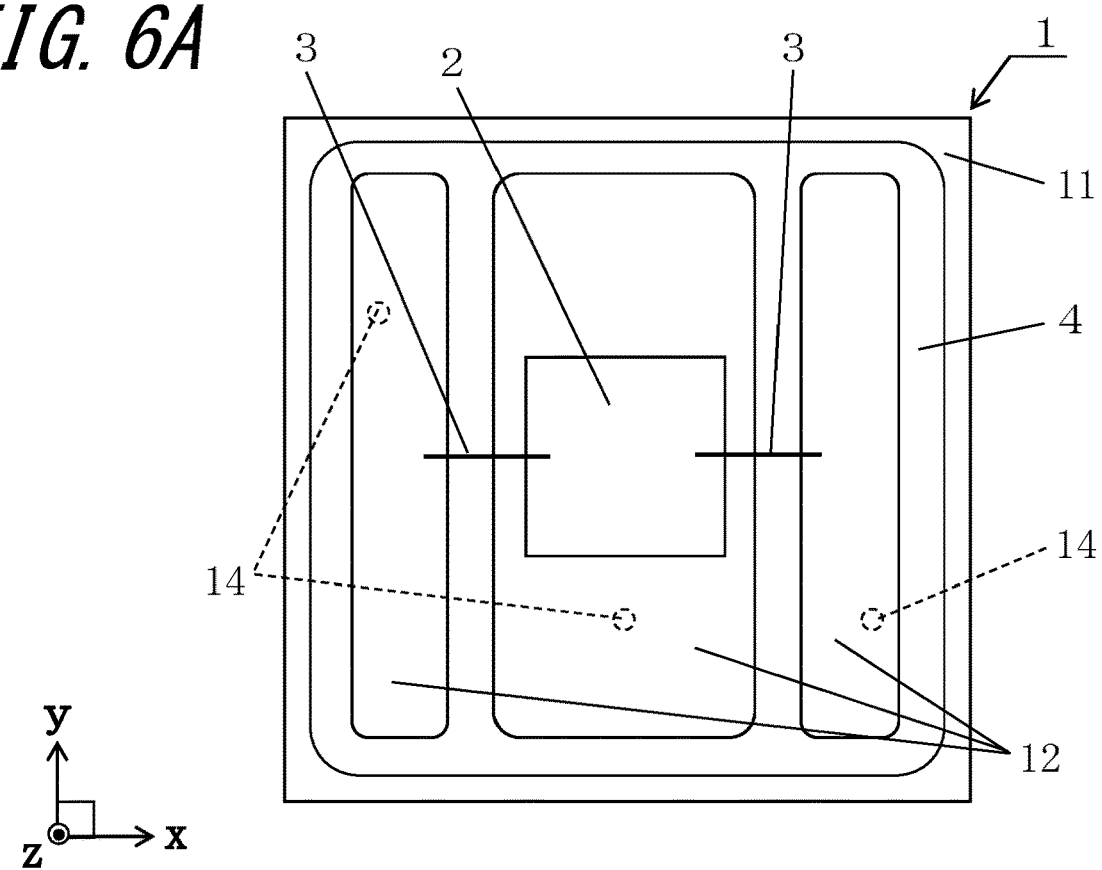
FIG. 6A is a top view of another electronic device according to the first embodiment of the present invention.
Figure 6B:
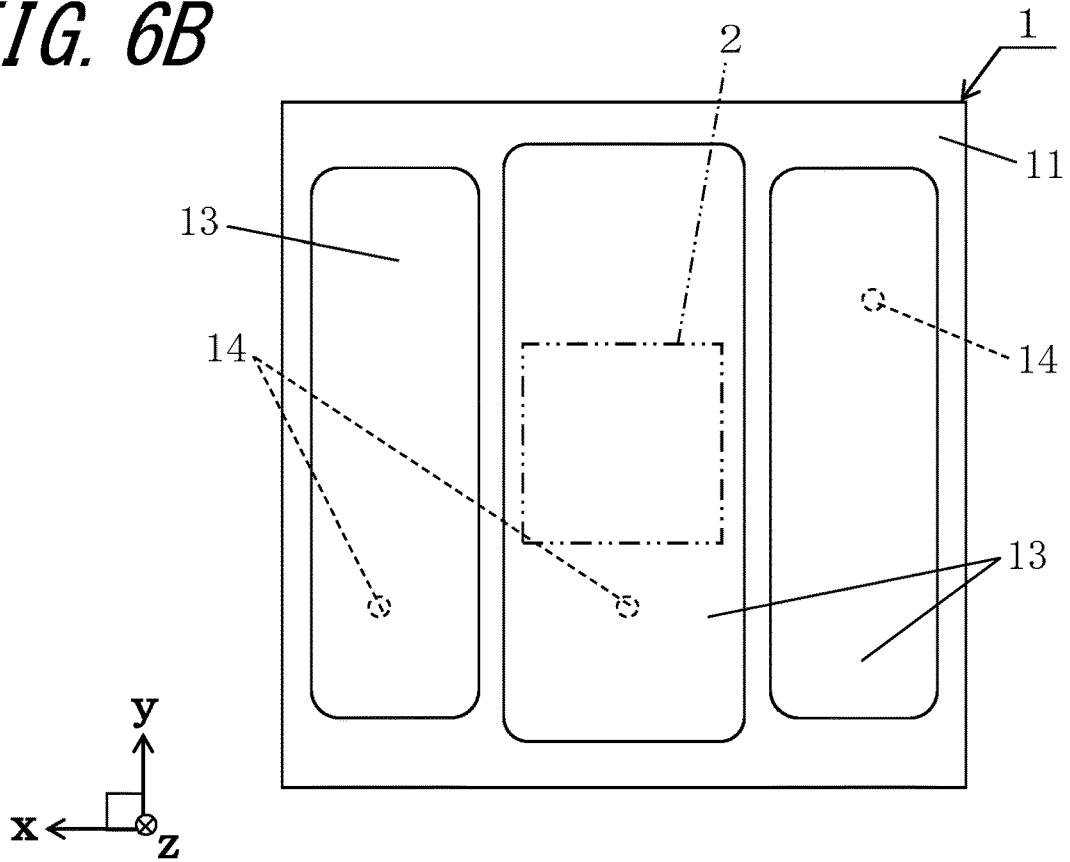
FIG. 6B is a bottom view of the electronic device shown in FIG. 6A.

As in the example shown in FIGS. 6A and 6B, three or more mount electrodes 12 or three or more terminal electrodes 13 may be arranged on the main surfaces of the insulating substrate 11. In the example shown in FIGS. 6A and 6B, electrodes included in the electronic component 2 and the mount electrodes 12 are electrically connected to each other using connection members 3 such as bonding wires. In the example shown in FIG. 6A, three mount electrodes 12 are arranged to face one another on the first main surface of the insulating substrate 11 along the pair of sides of the insulating substrate 11. In the example shown in FIG. 6B, three terminal electrodes 13 are arranged to face one another on the second main surface of the insulating substrate 11 along the pair of sides of the insulating substrate 11. As described for the above structure, the inner metal layer 15 may be superposed with the three mount electrodes 12 and the three terminal electrodes 13 in a perspective plan view.

Also in the example shown in FIGS. 6A and 6B, the inner metal layer 15 extends perpendicular to the mount electrodes 12 and the terminal electrodes 13. The inner metal layer 15 may extend perpendicular to the mount electrodes 12 and the terminal electrodes 13 and across the gaps between the mount electrodes 12 and between the terminal electrodes 13.

In the example shown in FIG. 2, the insulating substrate 11 contains a single inner metal layer 15 in a perspective plan view. The insulating substrate 11 may contain multiple inner metal layers 15.

The electronic device of the present embodiment includes the wiring board 1 having the above structure and thus has higher electrical reliability.

In the electronic module according to another embodiment of the present invention, the electronic device having the above structure is connected to the connection pads 51 on the module substrate 5 using the bond 6. The resultant electronic module can have long-term high reliability.

Second Embodiment

An electronic device according to a second embodiment of the present invention will now be described with reference to FIGS. 7A to 9B.

The electronic device according to the second embodiment of the present invention differs from the electronic device according to the above embodiment in that the insulating substrate 11 has a recess 16 in its first main surface between the mount electrodes 12 in a perspective plan view as in the example of FIGS. 7A to 9B.

Figure 7A:
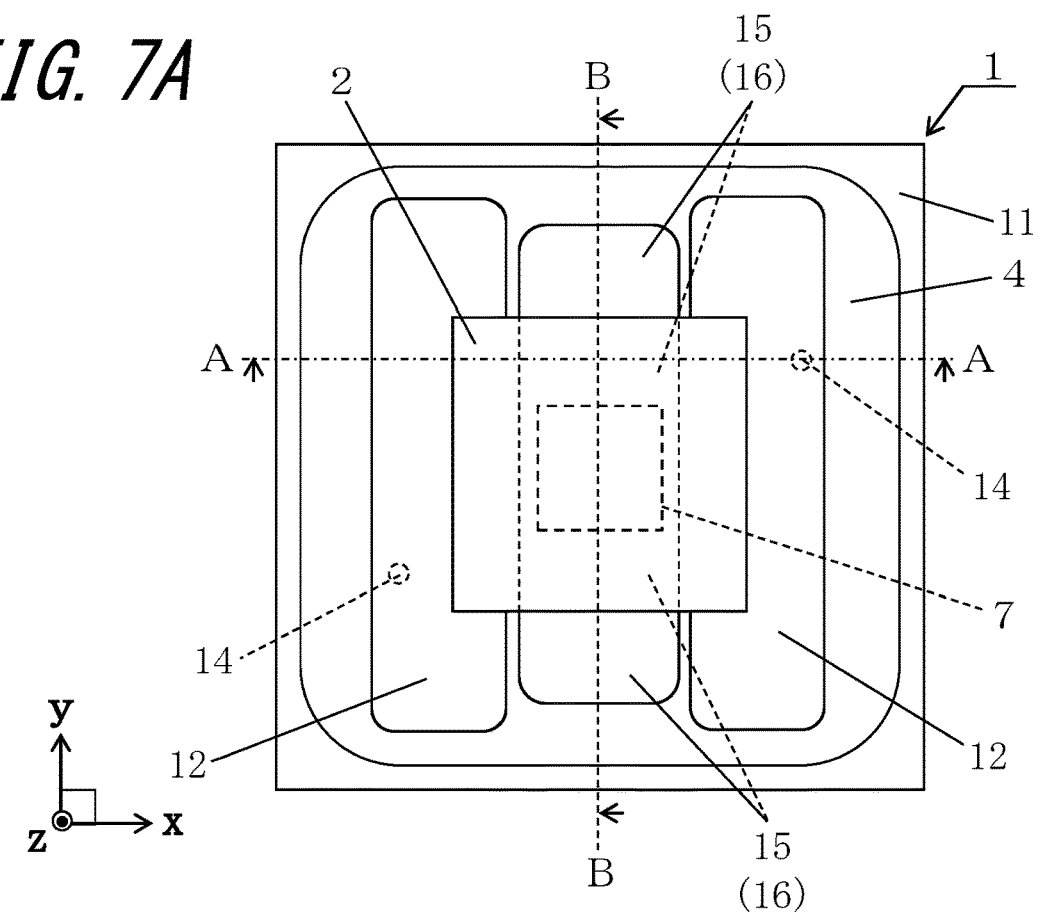
FIG. 7A is a top view of an electronic device according to a second embodiment of the present invention.
Figure 7B:
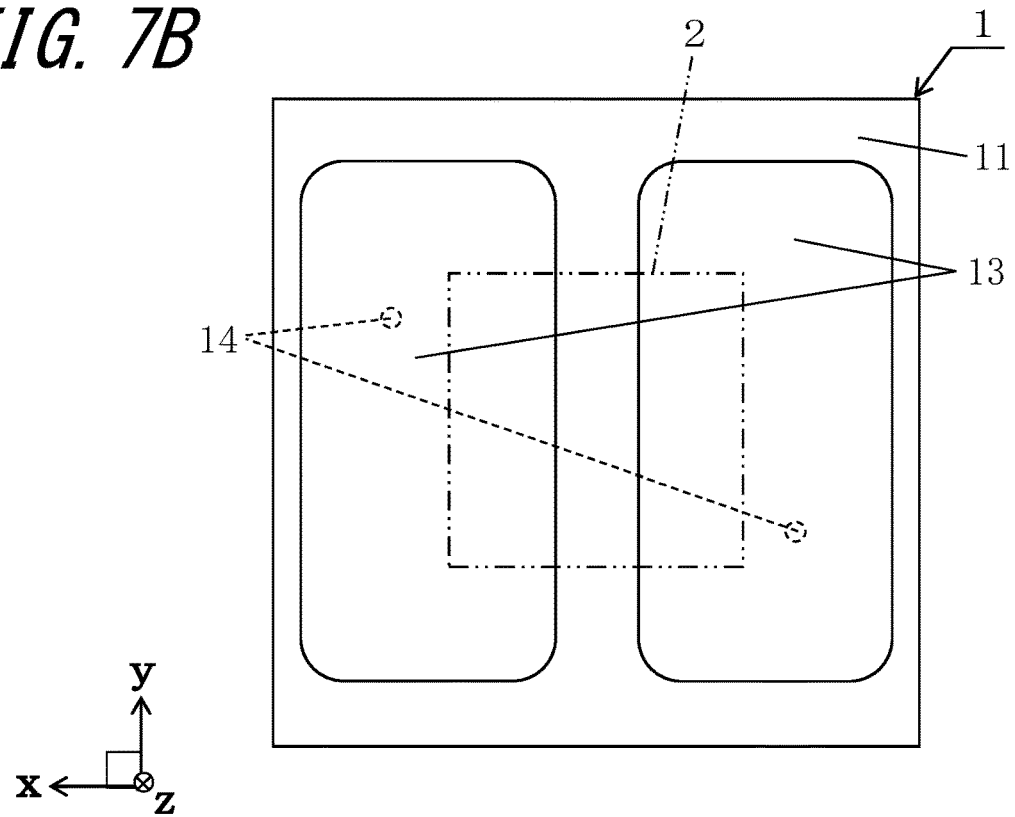
FIG. 7B is a bottom view of the electronic device shown in FIG. 7A.
Figure 8:
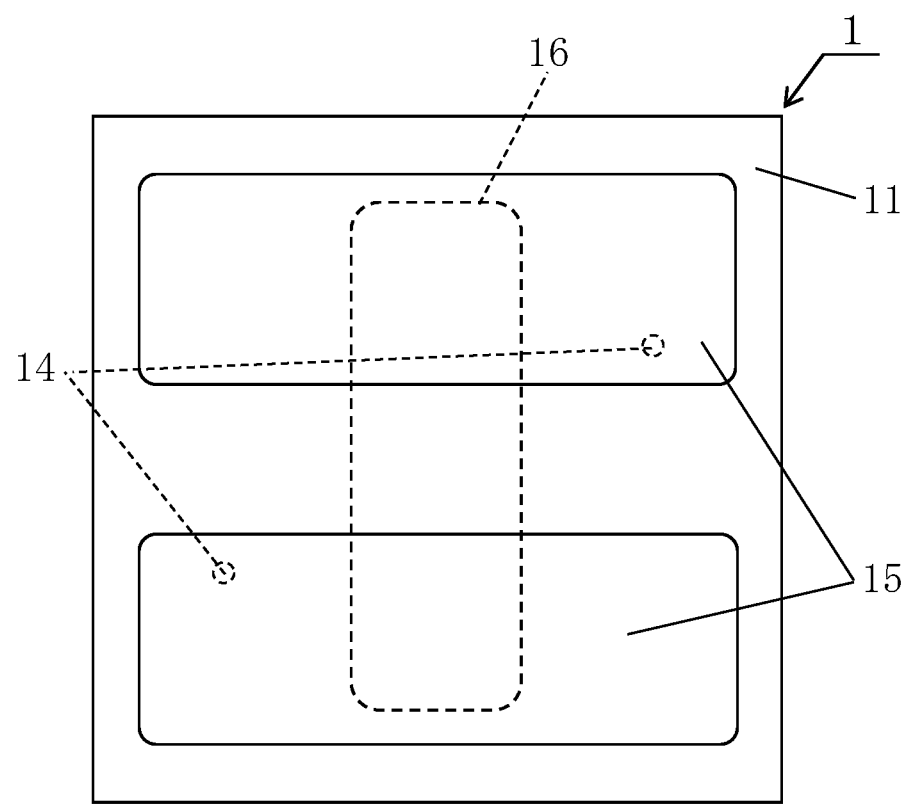
FIG. 8 is a top view showing the inside of a wiring board included in the electronic device shown in FIGS. 7A and 7B.
Figure 8:
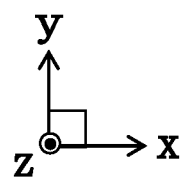
Figure 9A:
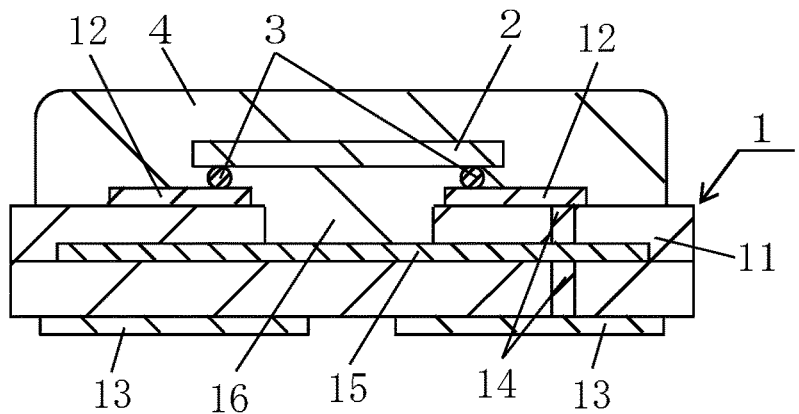
FIG. 9A is a longitudinal sectional view of the electronic device taken along line A-A in FIG. 7A.
Figure 9A:
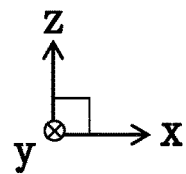
Figure 9B:
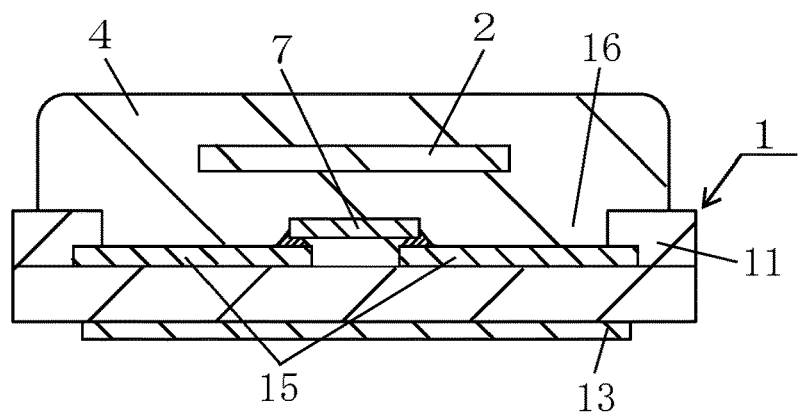
FIG. 9B is a longitudinal sectional view of the electronic device taken along line B-B in FIG. 7A.
Figure 9B:
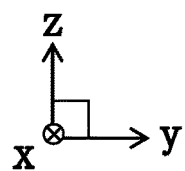

In FIG. 7B, a two-dot chain line indicates the region in which the electronic component 2 is placed in a perspective plan view. In FIG. 7A, a broken line indicates the region in which the electronic component 2 and another electronic component 7 are superposed in a perspective plan view. In FIG. 8, a broken line indicates the region in which inner metal layers 15 and the recess 16 are superposed. In FIGS. 7A to 8, broken lines indicate the region in which the mount electrodes 12, the terminal electrodes 13, the inner metal layers 15, and the wiring conductors 14 (feedthrough conductors) are superposed.

As in the first embodiment, if the wiring board 1 according to the second embodiment of the present invention receives high heat during use of the electronic device, the inner metal layers 15 extending perpendicular to the pair of opposing sides reduce the concentration of unidirectional thermal stress caused by differences in coefficients of thermal expansion between the insulating substrate 11 and the mount electrodes 12 and between the insulating substrate 11 and the terminal electrodes 13, and thus prevent the wiring board 1 from deforming and warping. The wiring board 1 with this structure has better connection to the electronic component 2 or to the module substrate 5, and can have high reliability.

The wiring board 1 according to the second embodiment has the recess 16. When, for example, the electronic component 2 is a light-emitting device, another electronic component 7, such as a Zener diode, may be placed in the recess 16. This structure prevents the two-dimensional area for mounting the another electronic component 7 from increasing, and does not block any light laterally emitted from the light-emitting device, unlike in an example having the another electronic component 7 arranged on the first main surface of the insulating substrate 11. The resultant light-emitting device can thus have a small size and high luminescence. The recess 16 may be encapsulated with, for example, resin containing a fluorescent agent or a reflective agent to improve the luminescence of the light-emitting device.

As in the example shown in FIGS. 7A to 9B, the recess 16 can serve as a region for mounting the another electronic component 7. In the example shown in FIGS. 7A to 9B, the recess 16 is rectangular in a plan view, but may include, for example, an oval area or an oblong area for mounting the another electronic component 7. The inner metal layers 15 connected to the wiring conductors 14, to which the another electronic component 7 is electrically connectable, extend to the bottom surface of the recess 16. The recess 16 can be formed by forming a through-hole defining the recess 16 in multiple ceramic green sheets for the substrate 11 with, for example, laser processing or punching using a die, and laminating these ceramic green sheets on a ceramic green sheet having no through-hole.

As in the example shown in FIGS. 7A to 9B, the recess 16 extends between and along the mount electrodes 12 in a perspective plan view. The recess 16 prevents the mount electrodes 12 from having a narrow portion, and improves the electric properties. The wiring conductors 14 can be electrically connected to the mount electrodes 12 and the terminal electrodes 13 in a reliable manner, and the electronic component 2 mounted on the wiring board 1 can be electrically connected to the module substrate 5 in a reliable manner. As in the example shown in FIGS. 7A to 9B, similarly to the first embodiment, the inner metal layers 15 arranged inside the insulating substrate 11 and partly serving as the bottom surface of the recess 16 in a perspective plan view may be perpendicularly superposed with their longitudinal direction extending perpendicular to the longitudinal direction of the mount electrodes 12 and the terminal electrodes 13 in a perspective plan view.

The wiring board 1 according to the second embodiment can be manufactured with a method similar to the above method for manufacturing the wiring board 1 according to the first embodiment.

Third Embodiment

An electronic device according to a third embodiment of the present invention will now be described with reference to FIGS. 10A to 12B.

An electronic device according to a third embodiment of the present invention differs from the electronic devices according to the above embodiments in that the insulating substrate 11 has a recess 16 in its second main surface between the terminal electrodes 13 in a perspective plan view in the example shown in FIGS. 10A to 12B.

Figure 10A:
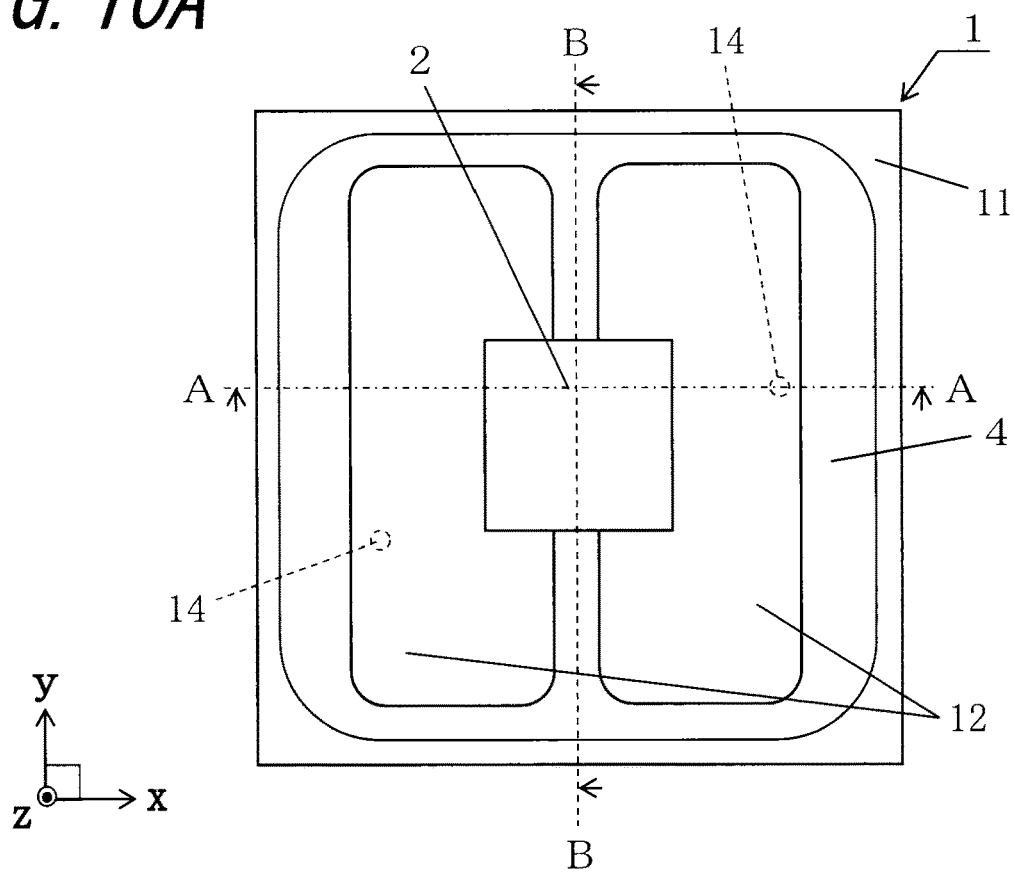
FIG. 10A is a top view of an electronic device according to a third embodiment of the present invention.
Figure 10B:
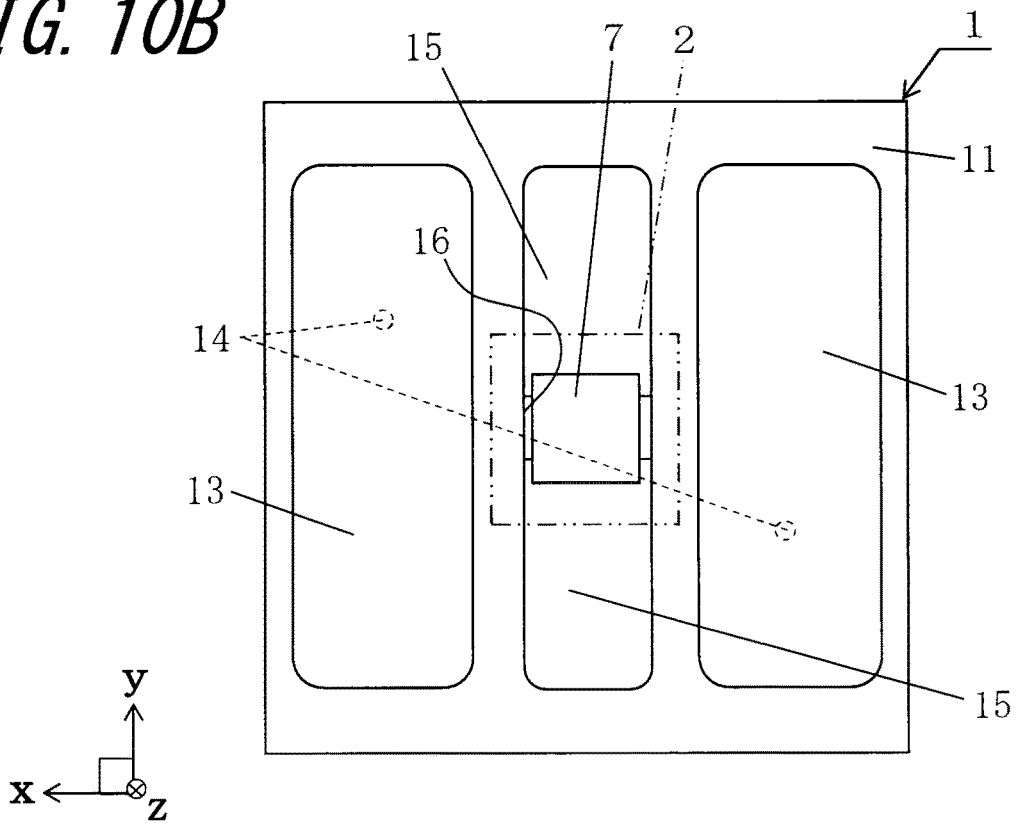
FIG. 10B is a bottom view of the electronic device shown in FIG. 10A.
Figure 11:
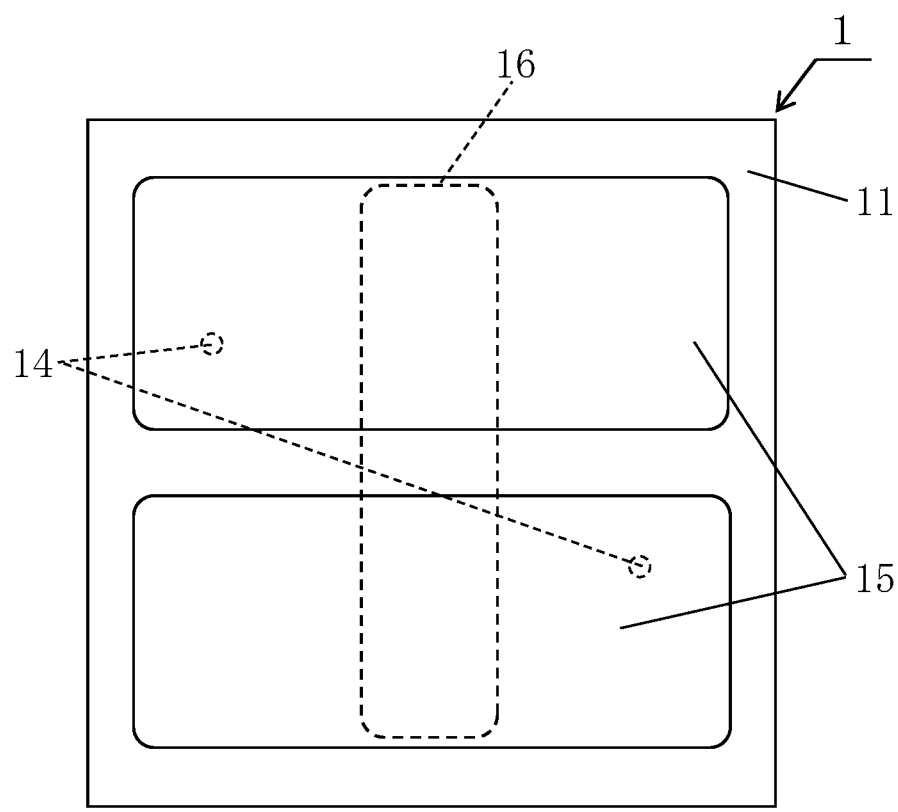
FIG. 11 is a bottom view showing the inside of the wiring board included in the electronic device shown in FIGS. 10A and 10B.
Figure 11:
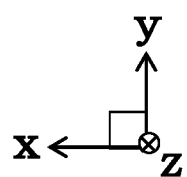
Figure 12A:
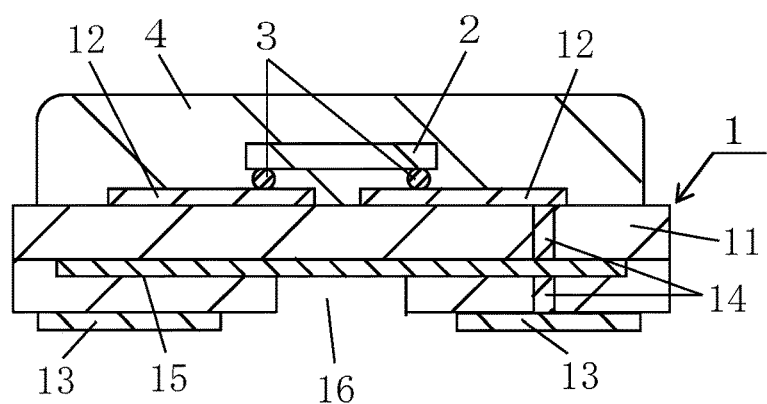
FIG. 12A is a longitudinal sectional view of the electronic device taken along line A-A in FIG. 10A.
Figure 12A:
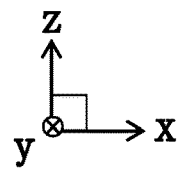
Figure 12B:
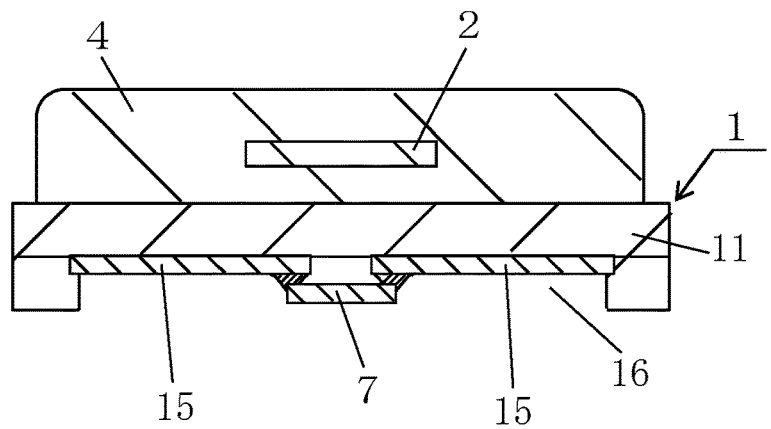
FIG. 12B is a longitudinal sectional view of the electronic device taken along line B-B in FIG. 10A.
Figure 12B:
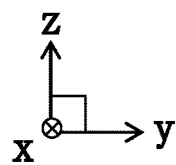

In FIG. 10B, a two-dot chain line indicates the region in which the electronic component 2 is placed in a perspective plan view. In FIG. 11, a broken line indicates the region in which inner metal layers 15 and the recess 16 are superposed. In FIGS. 10A to 11, broken lines indicate the regions in which the mount electrodes 12, the terminal electrodes 13, the inner metal layers 15, and the wiring conductors 14 (feedthrough conductors) are superposed.

As in the first embodiment, if the wiring board 1 according to the third embodiment of the present invention receives high heat during use of the electronic device, the inner metal layers 15 extending perpendicular to the pair of opposing sides reduce the concentration of unidirectional thermal stress caused by differences in coefficients of thermal expansion between the insulating substrate 11 and the mount electrodes 12 and between the insulating substrate 11 and the terminal electrodes 13, and thus prevent the wiring board 1 from deforming or warping. The wiring board 1 with this structure has better connection to the electronic component 2 or to the module substrate 5, and can have high reliability.

As in the example shown in 10A to 12B, the wiring board 1 according to the third embodiment of the present invention may have the recess 16 serving as a region for mounting the another electronic component 7 as in the second embodiment. The inner metal layers 15 connected to the wiring conductors 14, to which the another electronic component 7 is electrically connectable, extend to the bottom surface of the recess 16.

As in the example shown in FIGS. 10A to 12B, the recess 16 extends between and along the terminal electrodes 13 in a perspective plan view. The recess 16 prevents the terminal electrode 13 from having a narrow portion. The connection pads 51 on the module substrate 5 and the terminal electrodes 13 can be firmly joined together. As in the example shown in FIGS. 10A to 12B, similarly to the first embodiment, the inner metal layers 15 arranged inside the insulating substrate 11 and partly serving as the bottom surface of the recess 16 in a perspective plan view may be superposed with the plurality of mount electrodes 12 and the plurality of terminal electrodes 13 with their longitudinal direction extending perpendicular to the longitudinal direction of the mount electrodes 12 and the terminal electrodes 13 in a perspective plan view.

The wiring board 1 according to the third embodiment can be manufactured with a method similar to the above method for manufacturing the wiring board 1 according to the first or second embodiment.

The present invention is not limited to the examples described in the above embodiments and may be modified variously. For example, the insulating substrate 11 of the wiring board 1 may have its corners chamfered or cut in an arc shape in the thickness direction of the insulating substrate 11.

The terminal electrodes 13 are arranged on the second main surface of the insulating substrate 11. The insulating substrate 11 may have a hole formed through the side surface and the second main surface and having its inner surface covered by a terminal electrode 13, which forms a castellation conductor. The mount electrode 12 may also cover the inner surface of a hole formed in the side surface of the insulating substrate 11.

Figure 13A:
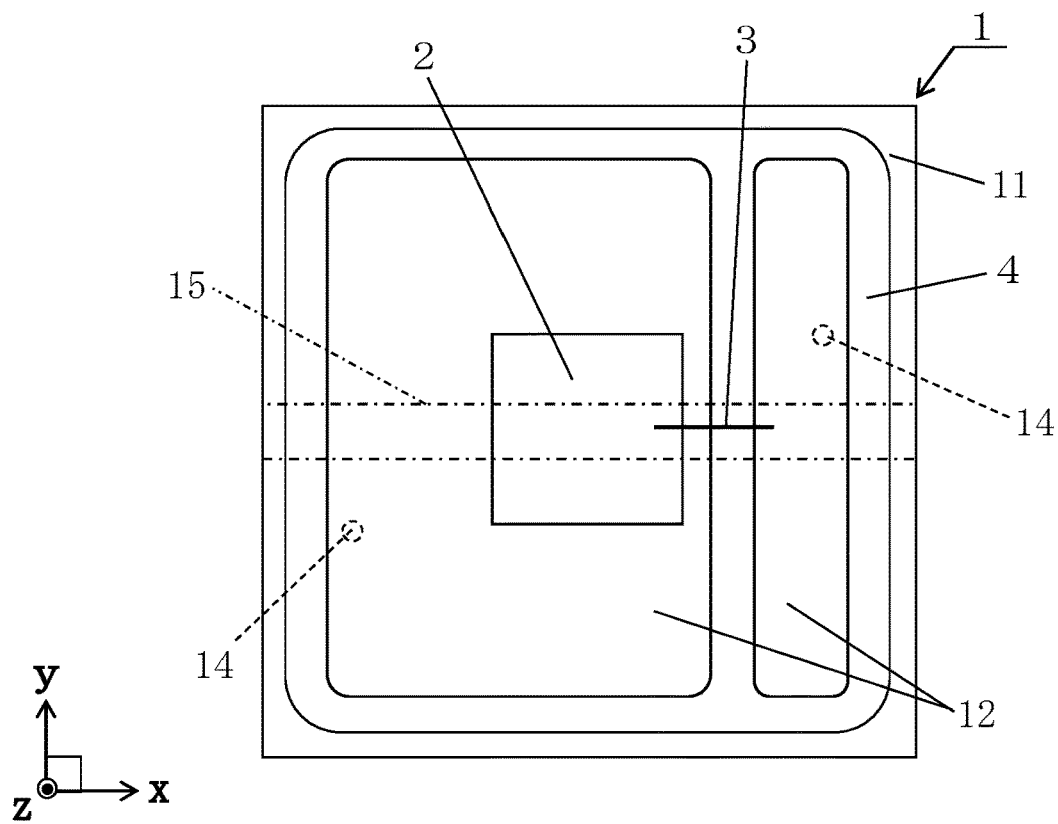
FIG. 13A is a top view of another electronic device according to the first embodiment of the present invention.
Figure 13B:
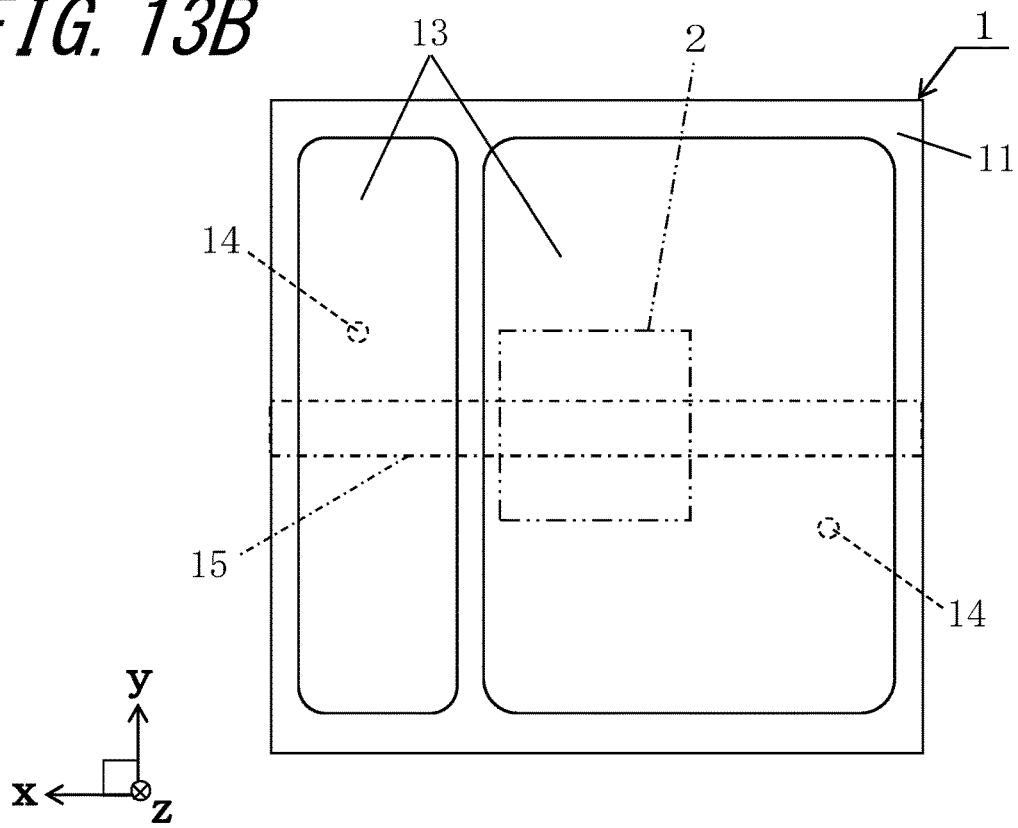
FIG. 13B is a bottom view of the electronic device shown in FIG. 13A.

As in the example shown in FIGS. 13A and 13B, the mount electrodes 12 or the terminal electrodes 13 may have different lengths or different widths.

The components of the wiring boards 1 according to the first to third embodiments may be combined. For example, the wiring board 1 according to the second embodiment may include three or more terminal electrodes 13 on the second main surface of the insulating substrate 11, or the wiring board 1 according to the third embodiment may include three or more mount electrodes 12 on the first main surface of the insulating substrate 11.

In the wiring boards 1 according to the first to third embodiments, the mount electrodes 12 and the terminal electrodes 13 are rectangular in a plan view. In some embodiments, the mount electrodes 12 or the terminal electrodes 13 may each have, for example, a protrusion or a cutout in their edges in a plan view to indicate, for example, the orientation of the wiring board 1 or the electronic device in a plan view.

In the above embodiments, the mount electrodes 12 and the terminal electrodes 13 are formed by co-firing. In some embodiments, the metal layer may be formed by, for example, post-firing or thin film deposition.

The invention claimed is:

1. A wiring board, comprising:
   an insulating substrate that is rectangular in a plan view;
   a plurality of mount electrodes arranged to face each other on a first main surface of the insulating substrate along a pair of opposing sides of the insulating substrate in a plan view;
   a plurality of terminal electrodes arranged to face each other on a second main surface of the insulating substrate along the pair of opposing sides of the insulating substrate in a perspective plan view; and
   an inner metal layer arranged inside the insulating substrate extending in a direction perpendicular to the plurality of mount electrodes, the inner metal layer overlapping with the plurality of mount electrodes and extending beyond the plurality of mount electrodes in the perspective plan view,
   the insulating substrate having a recess passing through the first main surface, between the mount electrodes in a perspective plan view, or having a recess passing through the second main surface, between the terminal electrodes in a perspective plan view,
   a portion of the inner metal layer being exposed to a bottom surface of the recess.

2. The wiring board according to claim 1, wherein
   the mount electrodes and the terminal electrodes have a longitudinal direction in a first direction in a perspective plan view, and
   the inner metal layer has a longitudinal direction in a second direction perpendicular to the first direction in a perspective plan view.

3. The wiring board according to claim 1, wherein
   an opening shape of the recess has a longitudinal direction in the first direction in a plan view.

4. The wiring board according to claim 1, wherein
   the recess passes through the first main surface and extends along the mount electrodes in a perspective plan view.

5. The wiring board according to claim 1, wherein
   the recess passes through the second main surface and extends along the terminal electrodes in a perspective plan view.

6. An electronic device, comprising:
   the wiring board according to claim 1; and
   a first electronic component mounted on the first main surface of the wiring board.

7. The electronic device according to claim 6, further comprising a second electronic component mounted in the recess of the wiring board.

8. An electronic module, comprising:
   the electronic device according to claim 6; and
   a module substrate including a connection pad to which the electronic device is connected using a bond.

* * * * *